United States Patent [19]
Eifuku et al.

[11] Patent Number: 6,000,127
[45] Date of Patent: Dec. 14, 1999

[54] ELECTRONIC PARTS MOUNTING METHOD

[75] Inventors: Hideki Eifuku, Omuta; Tadahiko Sakai, Fukuoka, both of Japan

[73] Assignee: Matsushita Electric Industrial Co., Ltd., Osaka, Japan

[21] Appl. No.: 08/907,001

[22] Filed: Aug. 6, 1997

[30] Foreign Application Priority Data

Aug. 8, 1996 [JP] Japan .................................. 8-209951

[51] Int. Cl.⁶ .................................................. H05K 3/32
[52] U.S. Cl. .................................. 29/840; 29/740; 29/832
[58] Field of Search ........................... 29/740, 840, 832; 156/630, 163; 228/180.22, 223; 438/108

[56] References Cited

U.S. PATENT DOCUMENTS

| | | | |
|---|---|---|---|
| 4,831,724 | 5/1989 | Elliott | 29/840 X |
| 5,037,780 | 8/1991 | Fujimoto et al. | 29/740 X |
| 5,115,545 | 5/1992 | Fujimoto et al. | 29/740 X |
| 5,205,032 | 4/1993 | Kuroda et al. | 29/740 |
| 5,214,308 | 5/1993 | Nishiguchi et al. | 257/692 X |
| 5,232,532 | 8/1993 | Hori | 29/741 X |
| 5,316,610 | 5/1994 | Tamaki et al. | 156/379.6 X |
| 5,385,632 | 1/1995 | Goossen | 156/630 |
| 5,722,160 | 3/1998 | Uemura et al. | 29/840 |
| 5,739,053 | 4/1998 | Kawakita et al. | 438/108 |
| 5,785,234 | 7/1998 | Weiss et al. | 228/223 |
| 5,802,712 | 9/1998 | Sakai et al. | 29/840 |
| 5,813,115 | 9/1998 | Misawa et al. | 29/832 |
| 5,816,478 | 10/1998 | Kaskoun et al. | 228/180.22 |
| 5,829,125 | 11/1998 | Fujimoto et al. | 29/840 |

*Primary Examiner*—Lee Young
*Assistant Examiner*—Rick Kiltae Chang
*Attorney, Agent, or Firm*—Stevens, Davis, Miller & Mosher, L.L.P.

[57] ABSTRACT

An electronic parts mounting method comprises a first step of forming precoatings on electrodes of a circuit board, a second step of depressing the bumps of an electronic part having bumps eat into the electrodes by pressing the electronic part having bumps to the circuit board with a mounting unit, and interposing a bonding agent between the electronic part having bumps and the circuit board, and a third step of carrying the circuit board to a thermal compression bonding unit and pressing while heating the electronic part having bumps to the circuit board with a thermal compression bonding head. This method is capable of preventing the electronic part having bumps from being deviated during carriage and allows works to be carried out in parallel with one another at a plurality of working stages, thereby enhancing a working efficiency.

4 Claims, 3 Drawing Sheets ered sequentially in a direction N2 where the circuit board 1 is carried. These units have a conveyor 13, a conveyor 14 and a conveyor 15 respectively which carry the circuit board 1 in the direction N2 and position it.

ELECTRONIC PARTS MOUNTING METHOD

BACKGROUND OF THE INVENTION

The present invention relates to a method for mounting electronic parts.

PRIOR ART

It has recently been widely used a method which fixes electronic parts to circuit board using bumps.

For fixing an electronic part having bumps to a circuit board, the method inevitably comprises a first process for mounting the electronic part having bumps on electrodes of a circuit board and a second process for pressing while heating the mounted electronic part having bumps to the circuit board.

When a plurality of processes are required for mounting an electronic part, it is generally desirable for enhancing a working efficiency to prepare a working stage for each of the processes and carry out the processes in parallel with one another at the working stages. When a working stage is prepared for each of the processes, however, a work is carried from a working stage to another as a matter of course.

FIGS. 3A through 3C show diagrams descriptive of the conventional electronic parts mounting method. Electrodes 2 and 3 are formed on a top surface of a circuit board 1 as shown in FIG. 3A. Further, bumps 6 and 7 made of solder are formed on a bottom surface of an electronic part 4 having bumps.

A mounting head 5 adsorbs a top portion of the electronic part 4 having bumps and mounts the electronic part 4 having bumps onto the circuit board 1 as indicated by an arrow N1. As a result, the bumps 6 and 7 are located on the electrodes 2 and 3 respectively as indicated by solid lines in FIG. 3B.

The circuit board 1 is subsequently carried to a thermal compression bonding unit and the electronic part 4 having bumps is often deviated during the carriage as indicated by dashed lines in FIG. 3B since the bumps 6 and 7 have a nearly spherical form and are extremely liable to slip.

When the electronic part 4 having bumps which is deviated from the circuit board 1 is pressed while being heated to the circuit board 1 with a thermal compression bonding head 8 of a thermal compression bonding unit, a mounted result is unsatisfactory as shown in FIG. 3C.

The conventional electronic parts mounting method is liable to allow the electronic part 4 to be often mounted erroneously when a working stage is prepared for each of the processes to fix the electronic part 4 having bumps onto the circuit board 1 as described above. Under the conventional method, it is therefore customary not to prepare a working stage for each of the processes but to perform the heating and pressing at the same time of mounting the electronic part 4 having bumps onto the circuit board 1 as shown in FIG. 3A.

However, this method poses a problem in that it lowers a working efficiency.

SUMMARY OF THE INVENTION

In view of the problem described above, the present invention has an object to provide an electronic parts mounting method which makes it possible to fix an electronic part having bumps onto a circuit board with a favorable working efficiency.

The electronic parts mounting method according to the present invention comprises a first step of forming precoatings on electrodes of a circuit board, a second step of pressing an electronic parts having bumps to the circuit board thereby depressing the bumps of the electronic part having bumps into the electrodes with a mounting unit in a condition where a bonding agent is interposed between the electronic part having bumps and the circuit board, and a third step of carrying the circuit board to a thermal compression bonding unit and pressing while heating the electronic part having bumps to the circuit board with a thermal compression bonding head.

PREFERRED EMBODIMENT OF THE INVENTION

Figure 1:
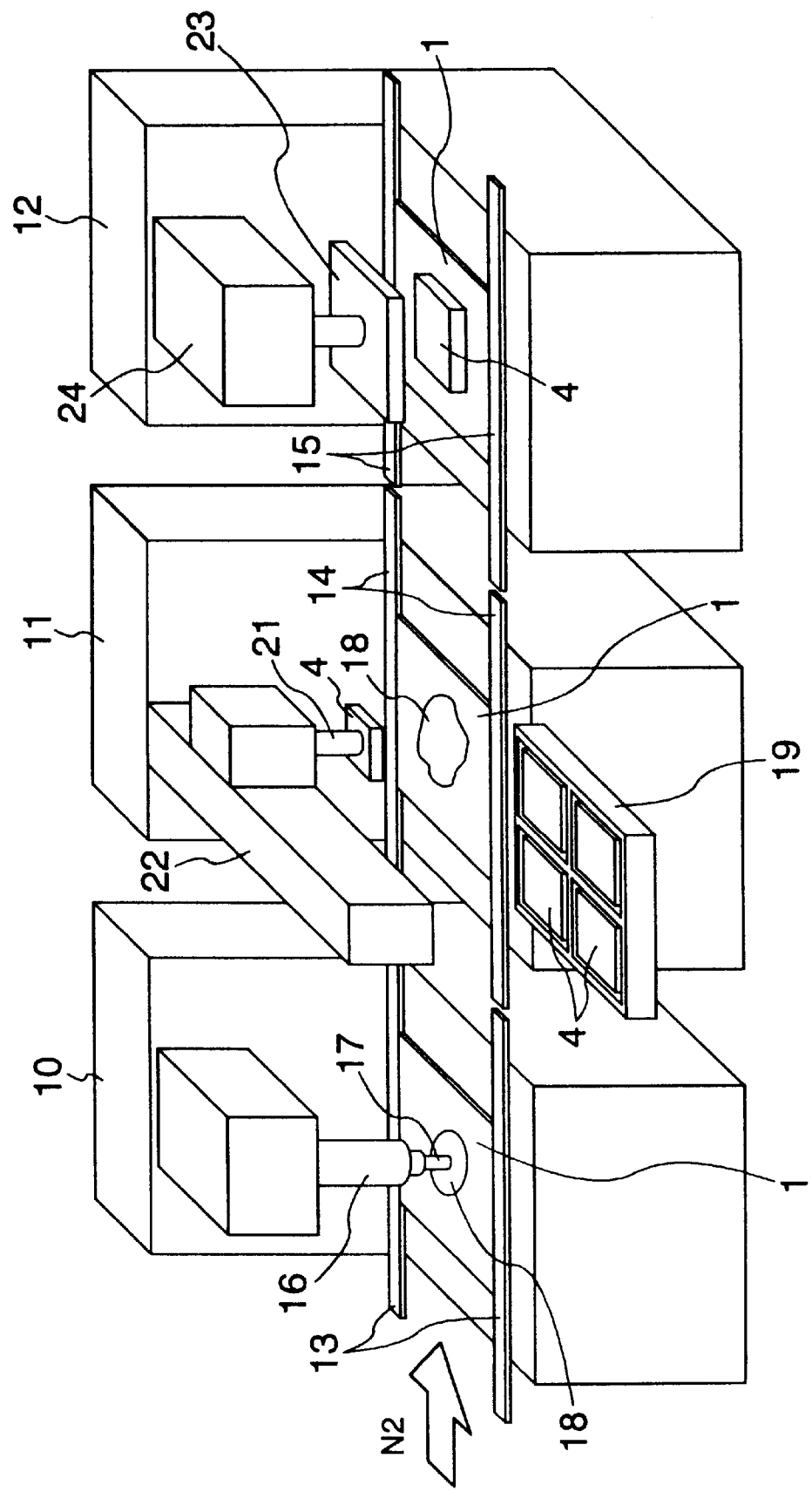
FIG. 1 is a perspective view of an electronic parts mounting system according to an embodiment of the present invention.

An electronic parts mounting method as claimed in claim 1 comprises a first step of forming precoatings on electrodes of a circuit board, a second step of pressing an electronic part having bumps to the circuit board thereby depressing the bumps of the electronic part having bumps eat into the electrodes with a mounting unit in a condition where a bonding agent is interposed between the electronic part having bumps and the circuit board, and a third step of carrying the circuit board to a thermal compression bonding unit and pressing while heating the electronic part having bumps to the circuit board with a thermal compression bonding head.

Accordingly, an electronic part 4 having bumps is fixed to a circuit board 1 at the second step. In other words, when the electronic part 4 having bumps is going to deviate from the circuit board 1 in an X-Y direction, a bump 6 which is depressed into a precoating 25 prevents the electronic part from deviating. Further, when the electronic part 4 having bumps is going to deviate from the circuit board 1 in a Z direction (vertical direction), a bonding agent 18 interposed between the circuit board 1 and the electronic part 4 having bumps prevents the electronic part from deviating in this direction. Furthermore, even if the electronic part 4 should deviate in the Z direction, the bump 6 returns into a recess formed in the precoating 25 due to the depressing of the bump 6 for correcting the deviation, thereby eliminating the possibility that the bump 6 may slip down from the precoating 25.

Therefore, the electronic part 4 is not deviated even when it is carried from a stage to another. As a result, the second step and the third step can be carried out at stages prepared exclusively therefor and a working efficiency can be enhanced by dividing the steps.

Now, an embodiment of the present invention will be described below with reference to the accompanying drawings.

FIG. 1 is a perspective view illustrating an electronic parts mounting system in accordance with an embodiment of the present invention.

As shown in FIG. 1, the electronic parts mounting system comprises an applicator unit 10, a mounting unit 11 and a thermal compression bonding unit 12 which are disposed sequentially in a direction N2 where the circuit board 1 is carried. These units have a conveyor 13, a conveyor 14 and a conveyor 15 respectively which carry the circuit board 1 in the direction N2 and position it.

Figure 2A:
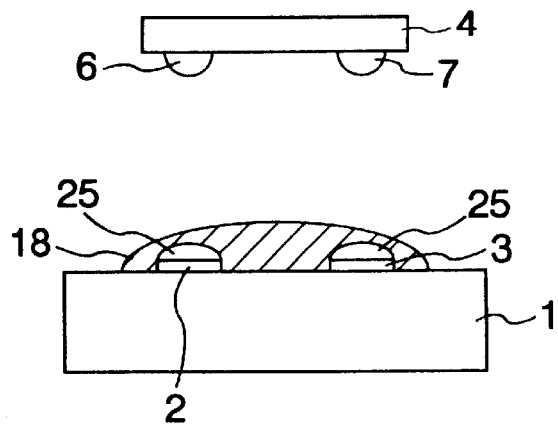
FIGS. 2A through 2C are diagrams which explain steps of an electronic parts mounting method according to an embodiment of the present invention.

Further, the applicator unit 10 discharges a bonding agent 18 reserved in a syringe 16 through a nozzle 17 and applies it to the circuit board 1. Further, precoatings 25 made of solder have already been formed on electrodes 2 and 3 of the circuit board 1 as shown in FIG. 2A.

Then, the electronic parts 4 having bumps are accommodated in a matrix form in a tray 19 disposed in front of the mounting unit 11. A mounting head 21 which is moved by a moving device 22 picks up required one of the electronic parts 4 having bumps out of the tray 19, and mounts and presses the electronic parts 4 having bumps onto the circuit board 1.

Furthermore, the thermal compression bonding unit 12 presses while heating the electronic part 4 having bumps to the circuit board 1 with lowering a thermal compression bonding head 23 which heated to approximately 220° C. by a driving member 24.

The electronic parts mounting system is divided into a working stage for applying the bonding agent, a working stage for mounting and pressing the electronic part, and a working stage for pressing and heating the electronic part, and configured such that the circuit board 1 is carried from one stage to another.

Then, processes of an electronic parts mounting method according to an embodiment of the present invention will be described with reference to FIGS. 2A through 2C. First, the applicator unit 10 applies the bonding agent 18 to the circuit board 1 and carries it to the mounting unit 11. An epoxy thermosetting resin is used as the bonding agent 18 in the present embodiment.

Figure 2B:
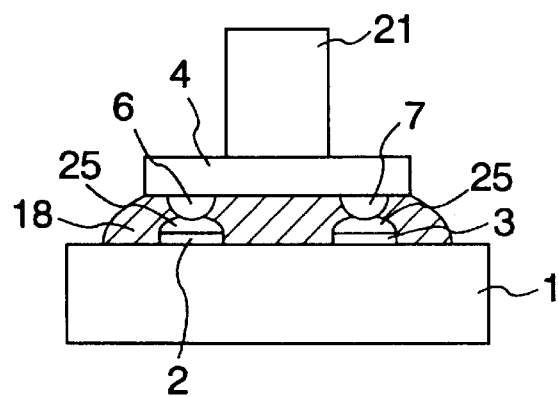

Next, as shown in FIGS. 2A and 2B, the mounting unit 11 mounts and presses the electronic part 4 having bumps onto the circuit board 1 with the mounting head 21. Accordingly, as shown in FIG. 2B, the precoatings 25 are plastically deformed, and bumps 6 and 7 are depressed into the pre-coating 25. If the electronic part 4 having bumps is subsequently going to deviate from the circuit board 1 in the X-Y direction, the bumps 6 and 7 which are depressed into the precoatings 25 do not allow the electronic part 4 to deviate in this direction. Further, even if the electronic part 4 should deviate in the Z direction, the bump 6 can easily return into a recess formed in the pre-coating 25.

It is preferable to make the bumps and the precoatings of gold and solder respectively so that the bumps can easily be depressed into the precoatings. Though other combinations can be considered, either of the bumps and the precoatings are to be made of solder.

Further, since the bonding agent 18 is inter-posed between the electronic part 4 having bumps and the circuit board 1, adhesion of the bonding agent 18 does not allow the electronic part 4 having bumps to deviate from the circuit board 1 even if it is going to deviate from the circuit board 1 in the Z direction.

Thus, no problem is posed since the electronic part 4 having bumps is temporarily adhered to the circuit board 1 and is not deviated from the circuit board 1 even when it is carried to the moving device 22.

Figure 2C:
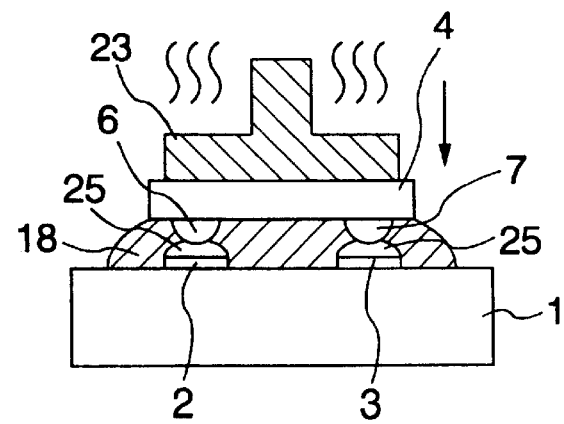
Figure 3A:
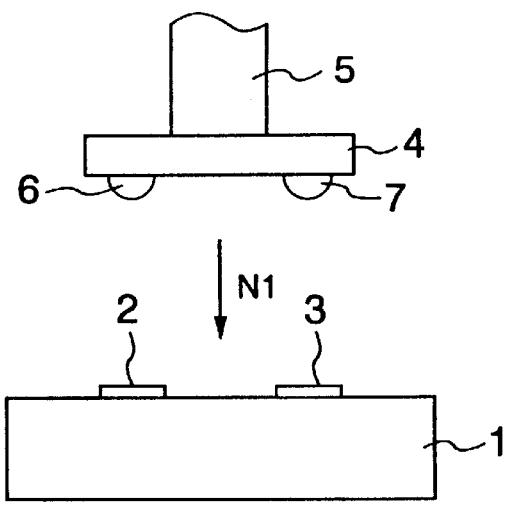
FIGS. 3A through 3C are diagrams which explain steps of a conventional electronic parts mounting method.
Figure 3B:
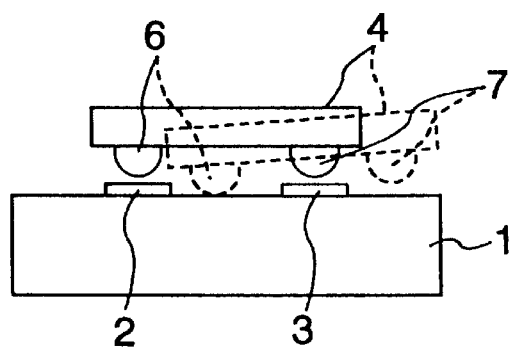
Figure 3C:
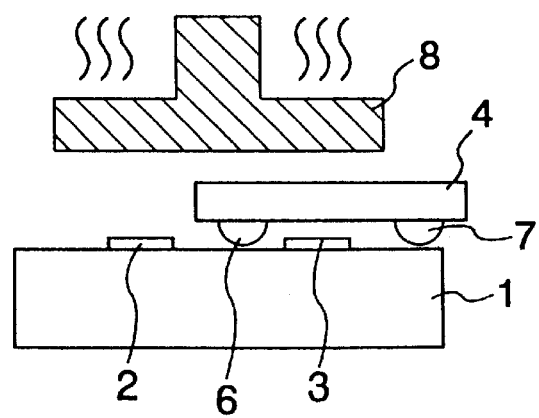

The electronic part 4 having bumps is pressed while being heated to the circuit board 1 by the thermal compression bonding head 23 of the thermal compression bonding unit 12 and then the thermal compression boding head 23 is detached from the electronic part 4 having bumps as shown in FIG. 2C.

As a result, the solder of the precoatings 25 is set after it is melted since it is cooled after being heated to its melting point. The bumps 6 and 7 are fixed to the electrodes 2 and 3 accordingly. Further, the bonding agent 18 is hardened, thereby fixing the electronic part 4 having bumps to the circuit board 1.

Though the embodiment is configured to meet both requirements of melting-setting of the solder and hardening of the bonding agent, the electronic part 4 having bumps may be heated so as to meet either of the requirements.

Further, an inspector apparatus which inspects the electronic part 4 having bumps may be disposed between the mounting unit 11 and the thermal compression bonding unit 12. This inspector apparatus is composed of a mechanism which presses the electronic part 4 having bumps from upside so as to press the bumps 6 and 7 to the precoatings 25 of the circuit board 1, a mechanism which brings an inspecting probe into contact with inspecting electrodes (not shown) of the circuit board 1 and an inspecting unit which inspects operations of the electronic part 4 having bumps through the probe. When the inspector apparatus detects a defect in the electronic part 4 having bumps, it removes the circuit board 1 on which the electronic part 4 is mounted and shifts it to a repair step. At this repair step, the circuit board 1 can be utilized once again since the bonding agent 18 has not been set yet and the electronic part 4 having bumps can be removed from the circuit board 1.

The electronic parts mounting method according to the present invention comprises a first step of forming precoatings on electrodes of a circuit board, a second step of depressing the bumps of an electronic part having bumps into the electrodes by pressing the electronic part having bumps to the circuit board with a mounting unit and interposing a bonding agent between the electronic part having bumps and the circuit board, and a third step of carrying the circuit board to a thermal compression bonding unit and pressing while heating the electronic part having bumps to the circuit board with a thermal compression boding head. This method does not allow the electronic part having bumps to deviate even when the circuit board is carried after the electronic part having bumps is mounted on the circuit board, thereby making it unnecessary to avoid the carriage. Accordingly, this method allows to prepare a working stage for each of processes, thereby allowing a working efficiency to be enhanced by carrying out works in parallel with one another at working stages.

What is claimed is:

1. A mounting method for electrically connecting an electronic part with bumps to electrodes of a circuit board said method comprising:

a first step of forming precoatings on the electrodes of the circuit board;

a second step of depressing the bumps of the electronic part into the precoatings formed on said electrodes by pressing the electronic part to said circuit board by means of a mounting unit in a condition where a bonding agent is interposed between said electronic part and said circuit board; and a third step of carrying said circuit board to a thermal compression bonding unit and pressing while heating said electronic part to said circuit board by means of a thermal compression bonding head.

2. The mounting method according to claim 1, wherein an applicator unit applies said bonding agent to said circuit board and carries said circuit board to said mounting unit.

3. The mounting method according to claim 1, wherein either of said precoatings and said bumps is made of gold and the other is made of solder.

4. The mounting method according to claim 1 wherein said precoatings are solidified after being melted, and said bonding agent is hardened at said third step.

\* \* \* \* \*